United States Patent [19]

Switky et al.

[11] Patent Number: 5,383,787
[45] Date of Patent: Jan. 24, 1995

[54] INTEGRATED CIRCUIT PACKAGE WITH DIRECT ACCESS TO INTERNAL SIGNALS

[75] Inventors: Andrew Switky, Palo Alto; Robert Osann, Jr., San Jose, both of Calif.

[73] Assignee: Aptix Corporation, San Jose, Calif.

[21] Appl. No.: 53,505

[22] Filed: Apr. 27, 1993

Related U.S. Application Data

[63] Continuation-in-part of Ser. No. 53,610, Apr. 27, 1993.

[51] Int. Cl.6 ............................................. H01R 9/09
[52] U.S. Cl. ................................................... 439/67
[58] Field of Search ................................ 439/68–74, 439/67, 77, 493

[56] References Cited

U.S. PATENT DOCUMENTS

| | | | |
|---|---|---|---|
| 3,319,216 | 5/1967 | McCullogh | 439/493 |
| 4,008,300 | 2/1977 | Ponn | 264/104 |
| 4,084,869 | 4/1978 | Yen | 439/70 |
| 4,558,397 | 12/1985 | Olsson | 361/404 |
| 4,652,970 | 3/1987 | Watari et al. | 361/385 |
| 4,688,864 | 8/1987 | Sorel | 439/74 |
| 4,692,790 | 9/1987 | Oyamada | 357/79 |
| 4,770,641 | 9/1988 | Rowlette | 439/86 |
| 4,832,612 | 5/1989 | Grabb et al. | 439/71 |
| 4,872,843 | 10/1989 | Anstey | 439/74 |
| 4,885,126 | 12/1989 | Polonio | 361/399 |
| 4,954,878 | 9/1990 | Fox et al. | 357/81 |
| 5,053,851 | 10/1991 | Berndlmaier et al. | 357/68 |
| 5,067,007 | 11/1991 | Kanji et al. | 357/74 |
| 5,068,714 | 11/1991 | Seipler | 357/80 |
| 5,127,837 | 7/1992 | Shah et al. | 439/71 |
| 5,176,524 | 1/1993 | Mizuno et al. | 439/68 |

*Primary Examiner*—Neil Abrams
*Attorney, Agent, or Firm*—D'Alessandro, Frazzini & Ritchie

[57] ABSTRACT

A package for one or more integrated circuit dice which includes a spreader which provides a conventional signal path between the die and a printed circuit board to which it is demountably attached as well as an additional, more readily accessible subset of signals, preferably available through a flexible cable extending horizontally from the package. The spreader provides a first set of contacts on a first side for interface to the integrated circuit dice, a second set of contacts on a second side opposite the first side which are connected to some of the contacts of the first set of contacts for connection to the printed circuit board, and a third set of contacts on the first side along one edge thereof for engaging the flexible cable and carrying the subset of signals.

14 Claims, 7 Drawing Sheets

INTEGRATED CIRCUIT PACKAGE WITH DIRECT ACCESS TO INTERNAL SIGNALS

This patent application is a continuation-in-part application of co-pending patent application Ser. No. 08/053,610 filed Apr. 27, 1993, entitled "Integrated Socket and IC Package Assembly," the disclosure of which is hereby incorporated herein by reference.

BACKGROUND OF THE INVENTION

1. Field Of The Invention

The present invention relates to integrated circuit packages. More particularly, the present invention relates to an integrated circuit package which provides direct access to the signals on the chip interconnect pins by means other than conventional pins or bumps extending from the bottom of the package.

2. The Prior Art

The package for an integrated circuit semiconductor device typically fulfills three functions. It provides environmental and physical protection for the silicon chip, it provides a means to facilitate handling of the chip, and it provides electrical connection from the chip to the system in which it is installed, typically through a printed circuit board or the like.

The most common package available for integrated circuit semiconductor devices are dual inline packages, quad flatpacks, and pin grid array packages. Dual inline packages have leads on the two long sides of a rectangular package body. The number of leads available on such packages is limited, seldom rising above 48 total input/output pins. Quad flatpacks, having leads on all four sides of a square or rectangular package body can have dramatically greater numbers of pins. It is possible, for instance, to have up to one hundred pins per side for a pin count greater than four hundred total input/output pins. Input/output pins in pin grid array packages populate the area underneath the package body in regular rows and columns. By placing the pins under the package body, much higher pin densities can be achieved. Products with more than 1000 total input/output pins are currently on the market in pin grid array packages.

With the increasing complexity of integrated circuits, particularly in the area of programmable integrated circuits, observability of electrical signals occurring at the chip and board levels has become more desirable. During prototyping, for instance, hardware engineers often need to show that a particular system meets design specifications. Tools such as logic analyzers and oscilloscopes are used by hardware engineers to verify a design. In order to do this, probes connected to the logic analyzers and/or oscilloscopes must also be connected to critical printed circuit board locations, generally at the location where an integrated circuit package pin is affixed to the printed circuit board. The ends of these probes typically employ spring loaded hooks for gripping the integrated circuit pins. A standard clip for a logic analyzer probe may be 0.015" wide or larger.

Several factors create problems for hardware engineers attempting to affix probes to important pins or nodes. As mentioned before, leads can be so close together as to make it virtually impossible to attach a conventional probe to a particular lead. Quad flatpack pins can have less than 0.010 inches between them; also, fragile quad flatpack leads can also be irreparably damaged by the hooks on the ends of the probes. The peripheral input/output pins for pin grid array packages may be accessible; however, access to the inner pins is simply not possible using conventional probe technology. A 1024-pin pin grid array package (32 rows of pins, 32 pins per row), for instance, has 124 accessible peripheral pins, only 12% of the total number of pins.

Faulty printed circuit boards, whether prototypes or production pieces, can be very difficult to diagnose. Determination of a problem is typically accomplished by probing various parts of the board to see if the signals coming from selected pins match the design's schematic. Again, with dense boards containing very tight pin-to-pin spacing, such probing can be extremely difficult or impossible with conventional probes.

It is possible to mount the integrated circuit packages on boards which, by means of printed circuit board technology, connect inaccessible pins to an array of pins outside the area covered by the integrated circuit package body. Such adapter boards require a much greater area than the integrated circuit package alone, thereby negating the benefits of reduced integrated circuit package size and placing integrated circuit packages close together. An additional problem with such adapters is that electrical signals from the integrated circuit package must travel greater distances to the probe points on the adaptor board than if the probe were attached directly to the integrated circuit pin. Significantly changing the lengths of signal paths frequently causes unacceptable delays in the analysis.

While it is sometimes possible to probe the side of the printed circuit board opposite the components (electrical traces at pin locations typically terminate in plated through-holes, sometimes called "vias", which allow access to electrical signals from both sides of the board), identifying the correct position is often not trivial. Identifying the correct via locations, particularly without adequate marking on the backside of the board, can be extremely difficult. Another problem with backside contacts is that boards with components on both sides are among the most difficult to probe. Vias from the pins of one particular integrated circuit package may be covered, and therefore made inaccessible, by another package on the backside of the board.

It is possible to correctly access such pins when the pin density of a printed circuit board is about 50–100 pins per square inch. Current integrated circuit packages can have pin densities as high as 3000 pins per square inch. At such high pin densities it becomes extremely difficult to attach analysis probes to the correct pins. Indeed, the analysis probes are so large in comparison to the space available about each pin that attaching analysis probes to certain configurations of pins may be impossible.

Die level functionality can be impossible to determine in a typical integrated circuit package. A large number of operations may happen at die level with no noticeable output at the input/output pins. There would be value, then, to accessing signals which would not normally terminate in an input/output pin.

While the prior art has defined the elements needed to protect integrated circuits and manufacture integrated circuit packages, there is a clear need for a an improved system of directly accessing the electrical signals contained within the integrated circuit package by means other that the input/output pins.

BRIEF DESCRIPTION OF THE INVENTION

In accordance with the present invention, an integrated circuit die is provided with a plurality of conductive bumps or pads ("pins") to allow input/output locations on the die to be electrically contacted. These bumps or pads are electrically joined to bond fingers or pads of a substrate or leadframe ("spreader"). These fingers or pads terminate at the input/output pin of the integrated circuit package. The current invention provides for the splitting of the signals from the input/output locations on the die into two groups of attachment points. The first group of attachment points includes traditional input/output pins for electrical connection to a printed circuit board. The second group contains pins or probe points at another more accessible location, such as the top of the integrated circuit package. The pins or probe points may be attached to a cable or bundle of wires which may be connected to a logic analyzer through a suitable connector.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons. The integrated circuit packaging technique of the present invention is now described in further detail with reference to the drawings which illustrate various embodiments within the scope of the invention.

Figure 1:
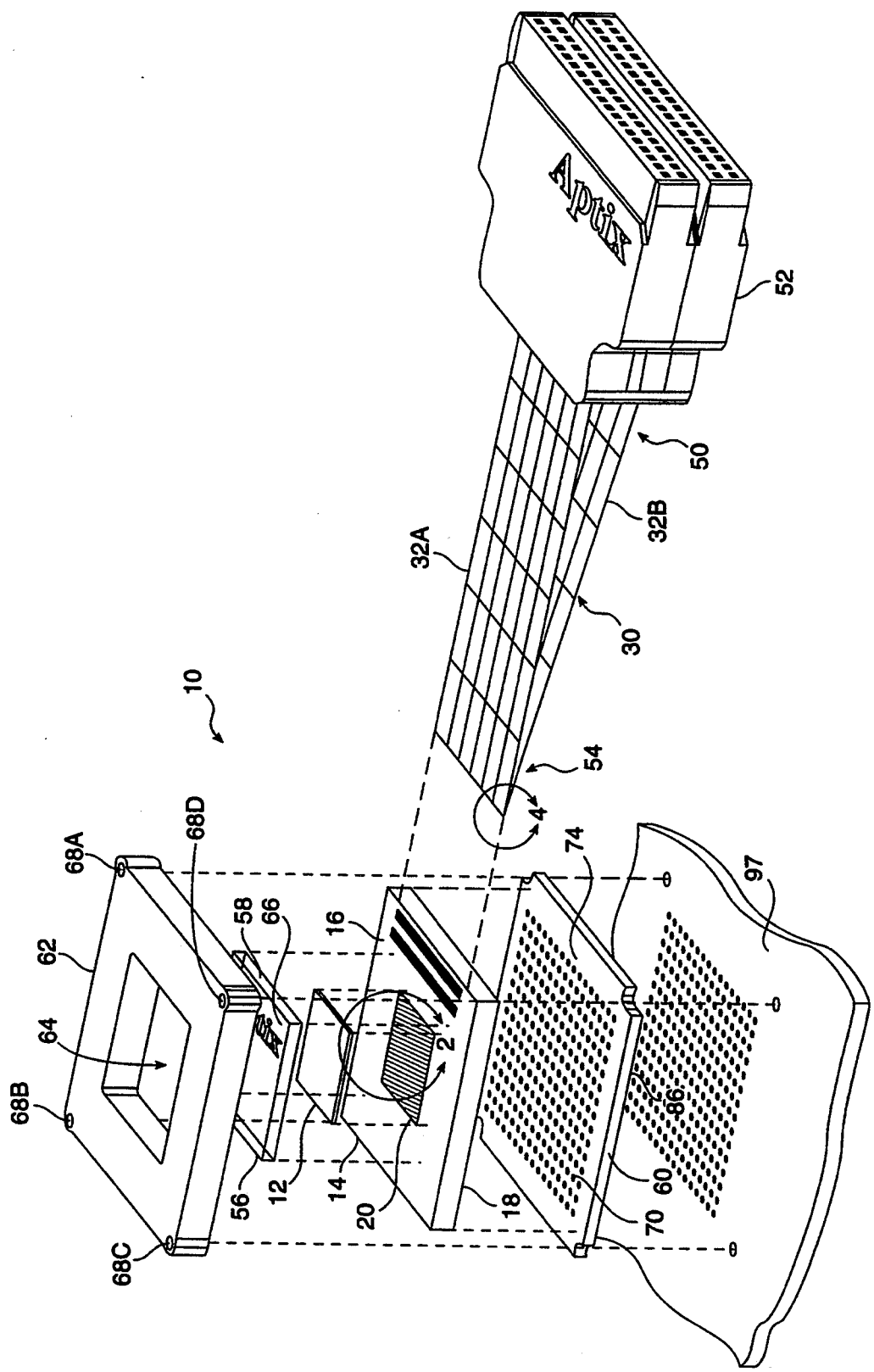
FIG. 1 is a perspective view of an integrated circuit package according to the present invention.
Figure 2:
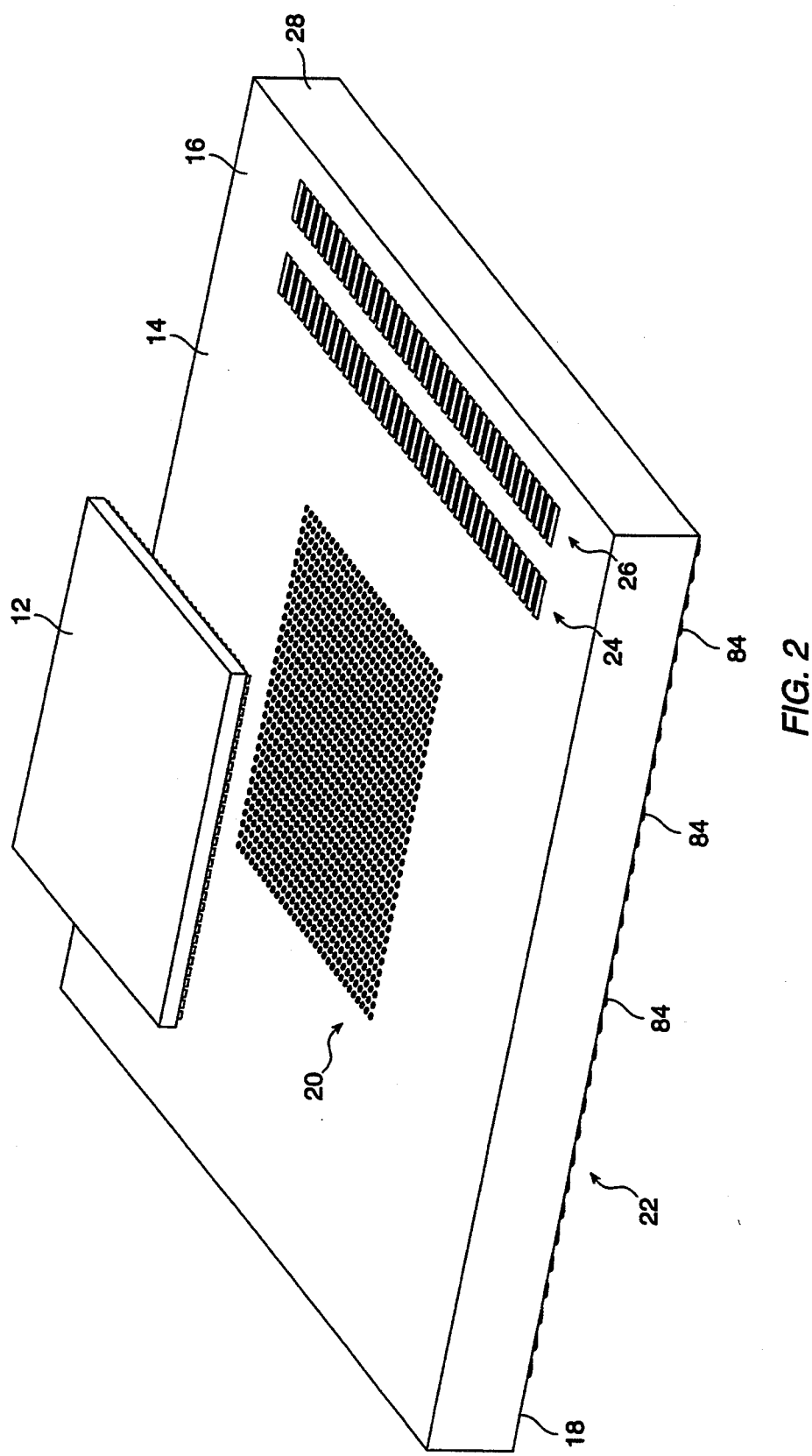
FIG. 2 is an enlarged view of area 2 of FIG. 1.

According to a preferred embodiment of the present invention an integrated circuit die having up to 1024 pins or more is packaged in a device package which includes a flexible cable extending horizontally from the device package on which are carried selected ones of the signals from the pins of the integrated circuit die. According to one presently preferred embodiment, the integrated circuit die is a Field Programmable Interconnect Component; however, the present invention is applicable to all types of integrated circuits. Turning now to FIGS. 1 and 2, the device package or socket 10 and connector assembly is shown. Die 12 is preferably an integrated circuit device fabricated on a substrate die having a 1024-pin connector array (32 rows×32 columns) on its bottom. The substrate die is preferably silicon, gallium arsenide, or other material known to those of skill in the art. Its size is preferably 0.52"×0.52" and it is preferably bonded by solder-bump flip-chip/C4 technology to a ceramic land-grid array spreader package 14. The chip carrier or spreader has a bump pitch of 0.0165" at the surface where die 12 is bonded to it. Those of skill in the art will realize that memory devices, microprocessor devices and other devices requiring a large number of input/output pins may use the invention herein. Such persons will also realize that other bonding and contact methods such as wires or joining pads may be used as well as the solder-bump flip-chip technology presently preferred herein.

Spreader 14 is preferably a 23 layer ceramic/tungsten pin spreader having a top 16 and a bottom 18. Spreader 14 may also be made of an organic insulating material as known to those of skill in the art. Spreader 14 consists of stacked layers of material with conductive lines etched or printed on the surface. By means of plated or filled holes, these conductive lines may be joined to conductive traces on an adjacent layer. By such means it is possible to follow an electrically conductive path from one of the conductive bump contacts on the top 16 of the spreader 14 to a conductive pad on the bottom 18 of the spreader. Top 16 has a land-grid array 20 of 1024 contacts adapted to bond to the 1024 pins of die 12 using conventional solder-bump flip-chip/C4 technology as is well known to those of ordinary skill in the art. The pitch is 0.0165". Bottom 18 has a land-grid array 22 of 1024 gold plated tungsten pads which are electrically connected on a one to one basis with the contacts on top 16 in a "spreader" configuration as is well known to those of skill in the art. The lands are arranged in a 32×32 array with a pitch of 0.040". Spreader 14 is preferably fabricated of a dimensionally stable ceramic such as 90% alumina and 10% glass which is available from the Kyocera Corporation of San Jose, Calif. Spreader 14 is preferably 0.130"H×1.38"W×1.38"L. A polyimide/copper thin film process could also be used to make the spreader as would be known to those of skill in the art. The dimensions of land grid array 20 on top 16 of spreader 14 are 0.52"×0.52". The dimensions of land-grid array 22 on bottom 18 of spreader 14 are 1.24"×1.24". Thus the pins are "spread" out.

Spreader 14 also comprises a first and a second set of sets of bonding pads 24, 26 preferably arrayed in two rows of forty pads each with a pitch of 0.025" adjacent one side 28 of spreader 14.

Flex cable 30 comprises preferably a pair of flexible printed circuit flexible circuit boards 32A, 32B, each having a single layer of electrical conductors comprised of 32 signal lines and interleaved ground lines. Flexible circuit members 32A, 32B are each preferably polyimide-copper-polyimide flex circuits such as those commonly used in 35 mm cameras and disk drive read/write heads and are well known in the art.

Figure 5A:
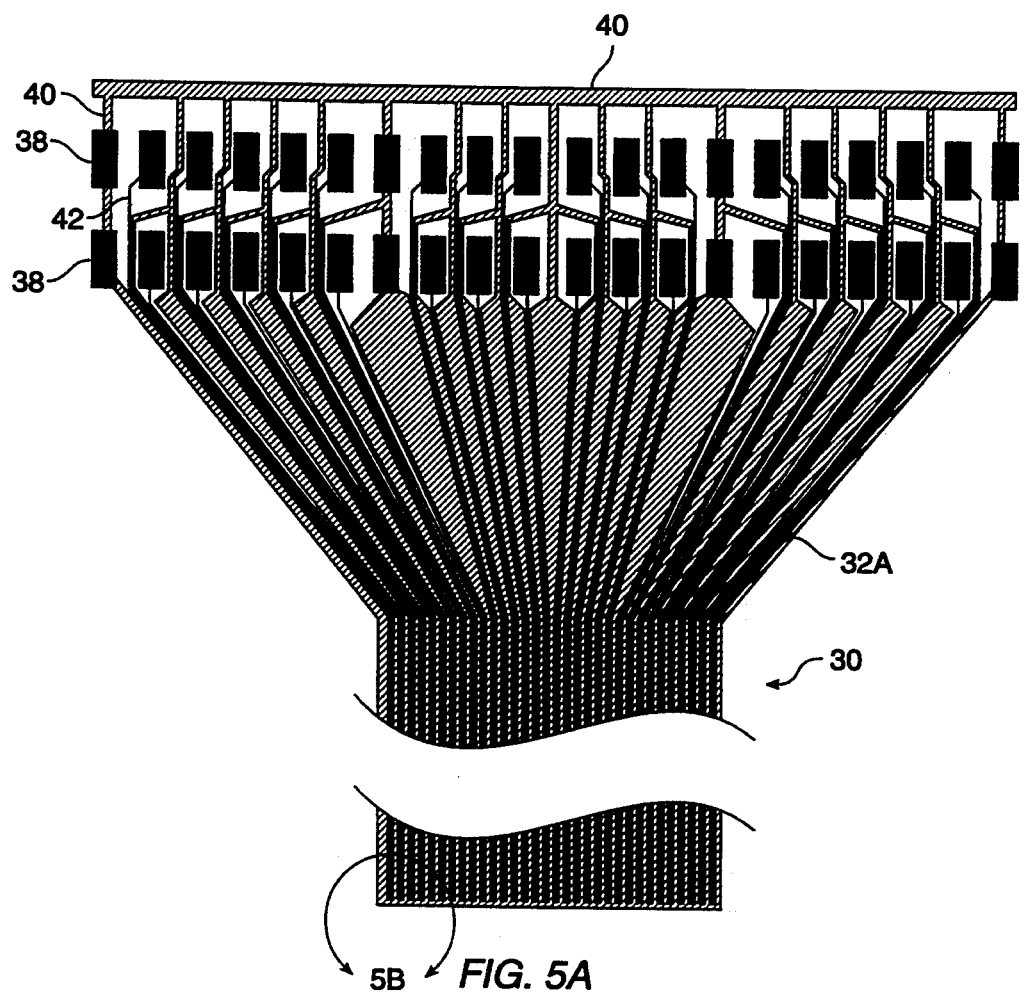
FIG. 5A is a drawing of the trace layout for the flexible cables of the present invention.
Figure 5B:
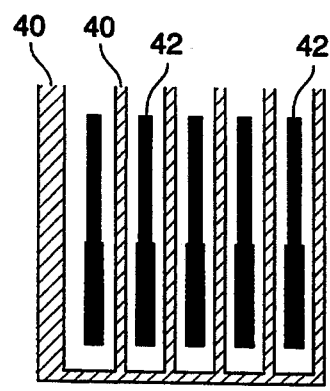
FIG. 5B is an enlarged drawing of the "5B" portion of FIG. 5A.
Figure 5C:
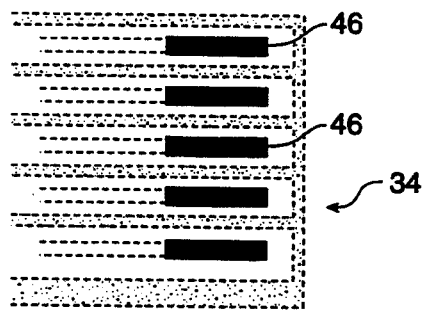
FIG. 5C is an enlarged drawing of the coverlay which covers the portion of the flexible cables shown in FIG. 5B.
Figure 6:
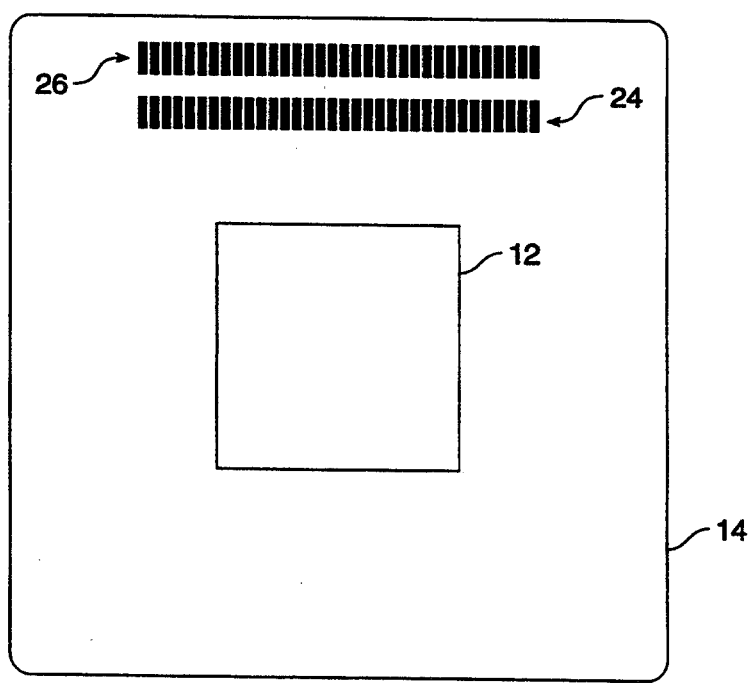
FIG. 6 is a drawing of the top of the ceramic spreader showing the flexible cable bonding pads.

Turning to FIGS. 4, 5A, 5B and 5C, the flex cable 30 is shown in detail. Copper traces are etched onto a copper-clad polyimide base 36 with standard photo-etching processes. A layer of polyimide film, called a coverlay 34 (as shown in FIG. 5C), is then bonded to the base 36. Coverlay 34 is provided with a window 35 to facilitate terminal access. Photoimageable mask 44 is placed over window 35 and apertures 45 are then etched therethrough using standard etching techniques. Alternatively apertures 45 may be routed, punched, or laser drilled. This method is preferred in order to isolate the signal lines 42 from the ground lines 40 and avoid shorting the two. FIG. 5B is an enlargement of portion 5B of FIG. 5A and shows the interleaving of ground lines 40 and signal lines 42 for improved signal transmission performance.

Flex cable 30 is attached to spreader 14 by use of a hot-bar solder reflow as well known to those of skill in the art. This process creates high-strength reliable joints and allows a flex cable's bond pads 38 to be bonded simultaneously.

Referring again to FIG. 1, first end 50 of flexible circuit members 32A, 32B is preferably electrically connected to an 80 pin (4 rows of 20 pins each) connector ("multi-conductor electrical connector") 52, a bolted together pair of part number 2-534206 connectors available from the Amp Corporation of Harrisburg, Pa. A second end 54 of flexible circuit members 32A, 32B is preferably electrically connected to first and second sets of bonding pads 24, 26 as is well known in the art. The individual bonding pads which comprise first and second sets of bonding pads 24, 26 comprise preferably 80 bonding pads which are electrically connected by conductive traces within the layers of spreader 14 as described above to selected ones of the conductive elements of the land-grid arrays 20, 22. In this manner, the signals available at selected ones of the conductive elements of the land-grid arrays 20, 22 are made available at the contacts of connector 52. Connector 52 is preferably adapted to plug into an adapter pod (not shown) which, in turn, is connected to an oscilloscope display or logic analyzer as is well known in the art.

A shell or cap 56 fabricated of plastic or ceramic having a recess 58 therein is adapted to fit over die 12 and be bonded with an epoxy glue to spreader 14. By covering die 12 in this manner, the likelihood of handling damage to die 12 is reduced.

According to a presently preferred embodiment of the present invention, die 12, after being bonded to spreader 14, is covered with an epoxy paste known as "B-Stage Epoxy" which is commonly available from a number of suppliers. This coating provides additional protection to die 12 from shock, contamination, and other sources.

Figure 3:
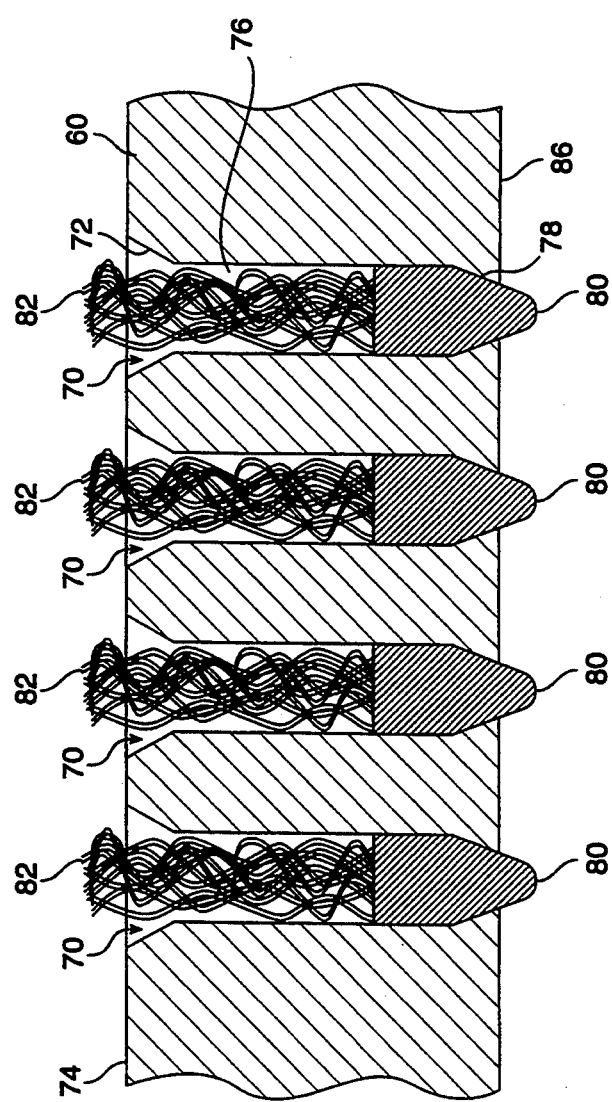
FIG. 3 is a cross sectional view of a portion of the lower package member.
Figure 4:
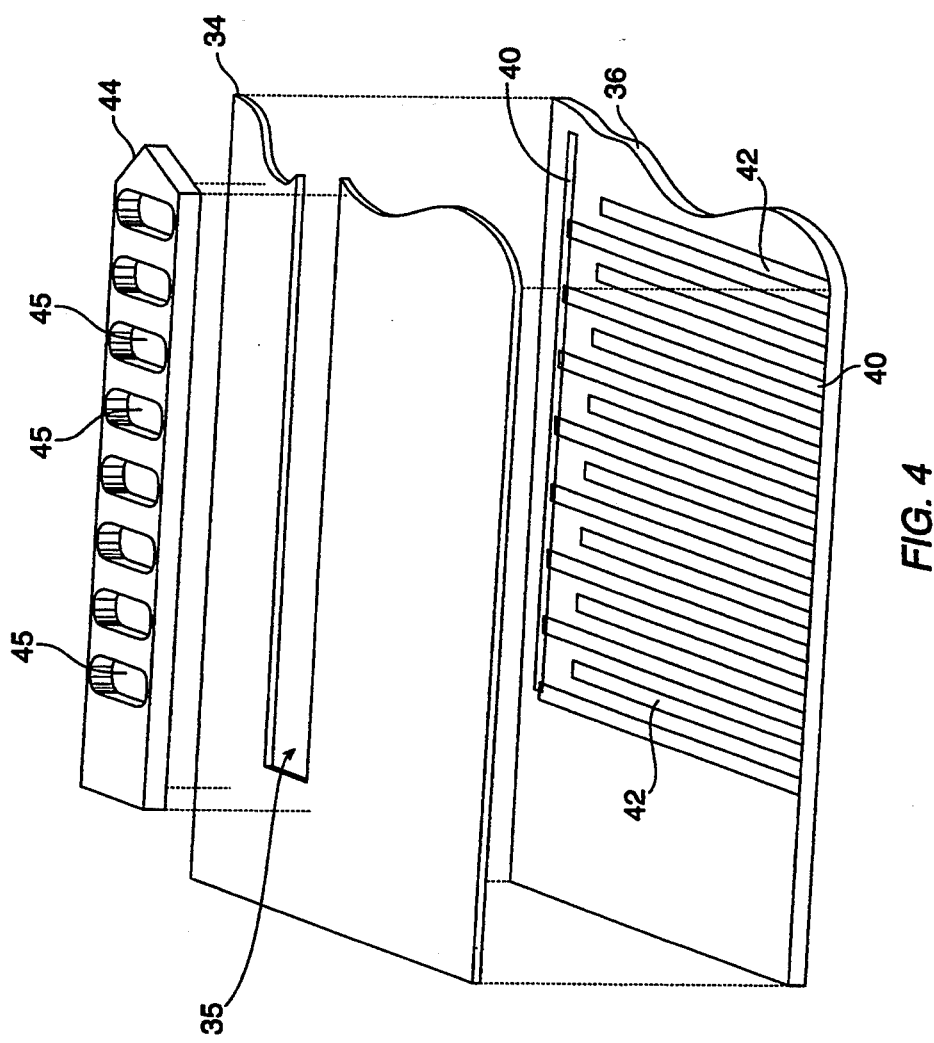
FIG. 4 is a perspective view of an enlargement of area 4 of FIG. 1.

The package 10 is completed by placing the above described assembly of die 12, spreader 14 and flex cable assembly 30 inside a sandwich made of socket base ("package base") 60 and socket cover ("package cover") 62. Socket cover 62 is preferably fabricated of a dimensionally stable plastic such as Ryton TM available from Phillips 66 Company of Bartlesville, Okla. Alternatively, metal may be used for socket cover 62 if heat dissipation from spreader 14 is required. Socket cover 62 preferably comprises a large aperture 64 through which printing 66 on the top of cap 56 may be seen. Socket cover 62 also includes apertures 68A, 68B, 68C and 68D through which mounting hardware such as nuts and bolts may be used for mounting package 10 to a printed circuit board or other device. Socket base 60 is preferably fabricated from a dimensionally stable plastic such as Ryton TM available from Phillips 66 Company of Bartlesville, Okla. Turning to FIG. 3, a cross sectional view of a portion of socket base 60 is depicted. Socket base 60 preferably comprises a round tapered aperture 70 corresponding to each of the pins or bumps on the bottom of die 12. Four of the preferred 1024 tapered apertures 70 are shown in FIG. 3. Each tapered aperture 70 preferably comprises a wide portion 72 which begins at the top 74 of socket base 60. Wide portion 72 tapers from a first diameter of 0.022 inches to a second diameter of 0.019 inches where it ends and straight portion 76 having a diameter of 0.019 inches begins. Socket base 60 is preferably 0.78 inches thick. Wide portion 72 is preferably about 0.008 inches thick. Narrow portion 78 of tapered aperture 70 tapers from a first diameter of 0.019 inches to a second diameter of 0.014 inches where it ends. Narrow portion 78 is preferably about 0.067 inches thick. Bullet shaped plunger contact ("plunger") 80 is preferably fabricated of gold plated brass and extends outside of the narrow portion 78 of tapered aperture 70. Button contact 82 is a cotton-like substance fabricated of gold wire of diameter 0.001 inches. Button contact 82 is in electrical contact with bullet shaped plunger contact 80 and preferably extends about 0.006 inches beyond the top 74 of socket base 60. Button contact 82 is adapted to make contact with the contact pads 84 (as shown in FIG. 2) of the land-grid array 22 on the bottom 18 of spreader 14. The flexibility of button contacts 82 helps guarantee a good electrical contact and allows conformance with the surface of spreader 14 which may not be perfectly flat. Similarly, bullet shaped plunger contacts 80 are adapted to extend about 0.006 inches beyond the bottom 86 of socket base 60 when uncompressed. For bullet shaped plunger contacts 80 button contacts 82 act as a biasing spring biasing the bullet shaped plunger contacts 80 against the narrow portion 78 of socket base 60. When package 10 is placed against a land-grid array or other contact pad area on a printed circuit board or like device, bullet shaped plunger contacts 80 may retract somewhat into tapered aperture 70 while maintaining electrical contact with button contacts 80 permitting package 10 to conform and make good electrical contact with the printed circuit board. This type of connector is available under the trade name CIN::APSE TM and is available from Cinch Connectors of Elk Grove Village, Ill.

Figure 7:
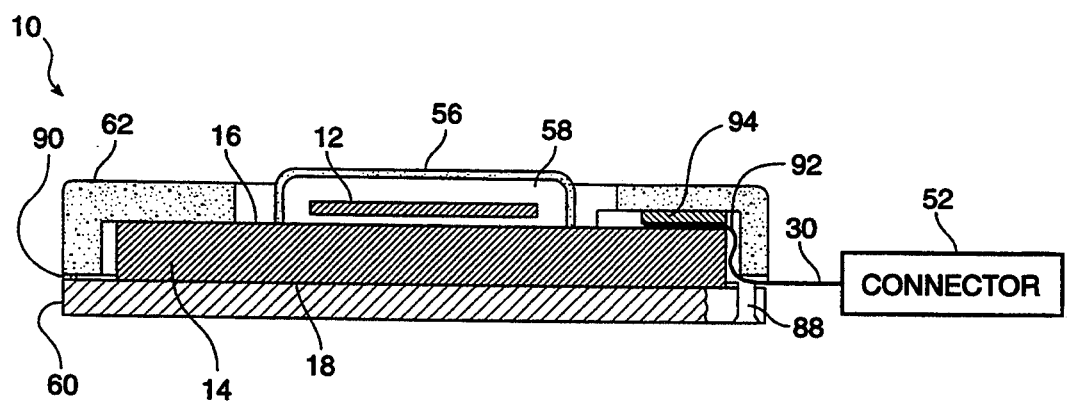
FIG. 7 is a cross-sectional drawing of an assembled device package according to the present invention.

Socket base 60 preferably has a plurality of apertures at its upper periphery (not shown) and socket cover 62 (as shown in FIG. 7) preferably has a like plurality of plastic pins or rivets 88 at its lower periphery which are adapted to mate and form an attachment mechanism by which socket base 60 and socket cover 62 may be permanently joined. This type of attachment mechanism is well known to those of skill in the art and need not be further described herein.

Socket base 60 preferably has a plurality of plastic alignment pins (not shown) extending downward from the periphery of its bottom 86. The alignment pins are preferably adapted to key to holes in the printed circuit board as an aid in aligning package 10 to the printed circuit board.

Turning to FIG. 7 a cross-sectional view of package 10 is shown. As can be seen by those of skill in the art, strain relief is provided to flex cable assembly 30 in at least three ways. Although a good hard tug can pull a cable from an unsocketed spreader 14, these three stress relief features in the flex cable and socket increase the cable pull strength to approximately 40 pounds per flex cable. First, the flex cables 32A, 32B (as shown in FIG. 1) exit the socket package 10 at the parting line 90 between socket cover 62 and socket base 60 below the level of the solder joints 92. A tug on the end of cables 32A, 32B in this configuration will not apply an axial force to the flex cable solder joints 92. The second feature is a strip of neoprene 94 applied to the inside of socket cover 62 to push against solder joints 92. The neoprene 94 absorbs a large portion of the stress on the solder joints 92. Finally, two small holes (not shown) are punched in each of flex cables 32A, 32B after they are attached to spreader 14. Two of the socket cover 62 rivets 88 (which are used to attach socket cover 62 to socket base 60 as described above) pass through these holes. Stress due to a pulled cable is therefore borne by these two pins, followed by the neoprene 94 and lastly by the solder joints 92.

Figure 8:
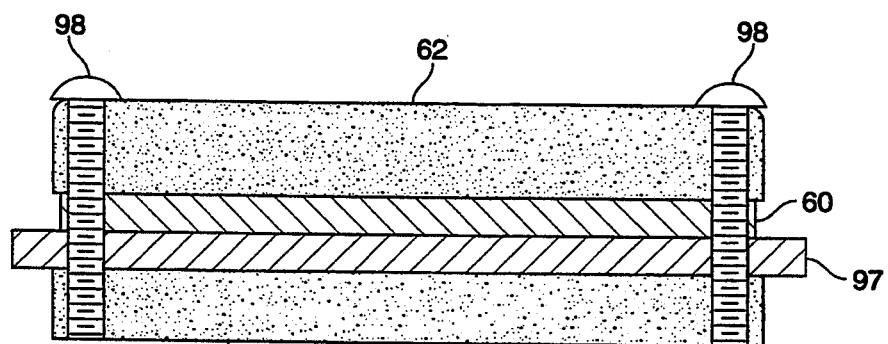
FIG. 8 is a diagram showing how a backing plate may be used to mount the package.

When spreader 14 is placed in socket package 10 it should be held against button contacts 82 with about 200 pounds of force (about 3 ounces per contact). To achieve this compressive force, the socket 10 is typically mounted to a printed circuit board or like device 97 with four screws 98, one in each corner of the socket. Because most printed circuit boards are unable to withstand 200 pounds of force without excessive warping, socket 10 preferably screws to a bolster or backing plate 96 that presses against the printed circuit board opposite socket 10 (see FIG. 8). Backing plate 96 and socket 10 are held to the circuit board by screws 98 which pass through apertures 68A-68D.

Figure 9:
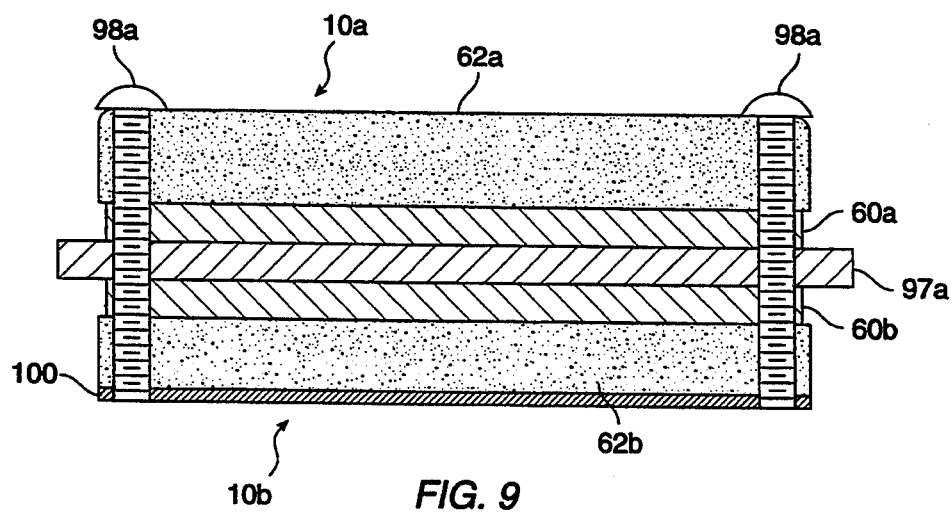
FIG. 9 is another embodiment of the invention.

To conserve board space or to provide unique electrical functions, it is possible to mount socket assemblies on both sides of the circuit board. Such an arrangement is depicted in FIG. 9. A pair of socket assemblies 10a, 10b are shown attached to opposite sides of circuit board 97a with screws 98a. As shown, screws 98a pass through the cover 62a of the top socket assembly 10a, through the circuit board 97a, through the cover 62b of the bottom socket assembly 10b, and fasten to a support ring or plate, or a nut. In FIG. 9, support plate 100 is threaded to receive screws 98a.

It is to be understood that the invention is not restricted to a socket for a single IC die as two or more dies could just as easily be mounted to spreader 14.

The use of the integrated circuit package of the present invention represents a significant improvement over the prior art. By employing the package 10 of the present invention, ready access to IC pins, ease of diagnosis and decreased turn around time in development of electronic products are achieved.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A reusable, self-contained integrated circuit die package for demountable attachment to a circuit board comprising:
   at least one integrated circuit die including a plurality of interface pins;
   a spreader having a first surface, a second surface, a first set of spreader electrical contacts disposed on said first surface and adapted to be electrically connected to said plurality of interface pins of said at least one integrated circuit die, a second set of spreader electrical contacts disposed on said second surface at least some of the members of which are electrically connected to at least some members of said first set of spreader electrical contacts and adapted for electrical connection to a circuit board, and a third set of spreader electrical contacts at least some of the members of which are electrically connected to at least some members of said first set of spreader electrical contacts, wherein said second set of spreader electrical contacts are disposed on a different surface of said spreader than are said third set of spreader electrical contacts;
   a socket base having a first surface and a second surface and a first array of conformal electrical contacts extending through and beyond said first surface of said socket base and adapted to make electrical contact with the contacts of said second set of spreader electrical contacts, said first array of conformal electrical contacts in electrical contact with a second array of non-deformable conformal electrically conductive plungers extending through and beyond said second surface of said socket base and adapted to electrically contact electrically conductive pads on the circuit board;
   a socket cover attached to said socket base by compressive attachment means for applying a compressive force urging said spreader against said first conformal contacts;
   means located only at a periphery of the package for removably attaching the package to a circuit board by applying a compressive force urging all portions of the package toward said circuit board; and
   a flexible electrical cable having a first end, a second end, and a plurality of electrical conductors, wherein at least some members of said plurality of electrical conductors at said first end are electrically connected to at least some members of said third set of spreader electrical contacts.

2. The package of claim 1 further comprising a multiconductor electrical connector disposed on said second end of said flexible electrical cable.

3. The package of claim 2 wherein said third set of spreader electrical contacts is disposed on said first surface of said spreader and said flexible electrical cable extends horizontally from the package.

4. A reusable, self-contained package for demountable attachment to a circuit board for housing at least one integrated circuit die having a plurality of input/output pins comprising:
   a spreader having a first set of spreader electrical contacts disposed on a first spreader surface thereof, a second set of spreader electrical contacts disposed on a second spreader surface thereof opposite said first spreader surface, and a third set of spreader electrical contacts disposed on said first spreader surface, said first set of spreader electrical contacts bounded by a first area and adapted to be permanently electrically and physically connected to the plurality of input/output pins, said second set of spreader electrical contacts in electrical contact with at least some members of said first set of spreader electrical contacts and bounded by a second area larger than said first area, said third set of spreader electrical contacts in electrical contact with at least some members of said first set of spreader electrical contacts;
   a cap bonded to said first spreader surface and covering said integrated circuit die;
   a socket base having a first and a second surface and having an array of interstices therethrough;
   a plurality of first conformal contacts inserted into said interstices and extending through and beyond said first surface of said socket base, said first conformal contacts in electrical contact with the members of said second set of spreader electrical contacts;

a plurality of second conformal contacts inserted into said interstices and extending through and beyond said second surface of said socket base, said second conformal contacts comprising electrically conductive non-deformable plungers in electrical contact, respectively, with said first conformal contacts and adapted to make removable electrical contact with contact pads of the circuit board;

a socket cover attached to said socket base by compressive attachment means for applying a compressive force urging said spreader against said first conformal contacts;

means located only at a periphery of the package for removably attaching the package to a circuit board by applying a compressive force urging all portions of the package toward said circuit board; and a flexible electrical cable having a first end, a second end, and a plurality of electrical conductors, wherein at least some members of said plurality of electrical conductors at said first end are electrically connected to at least some members of said third set of spreader electrical contacts.

5. The package of claim 4 further comprising a multi-conductor electrical connector disposed on said second end of said flexible electrical cable and electrically connected thereto.

6. The package of claim 5 wherein said flexible electrical cable extends horizontally from the package.

7. The package of claim 6 wherein said package base and said package cover are joined at a common line and said flexible electrical cable extends through said common line.

8. A reusable, self-contained package for at least one integrated circuit die having a plurality of pins, said package comprising:

at least one integrated circuit die having a plurality of electrical interface pins;

a spreader having a first spreader surface and a second spreader surface and including a first set of spreader electrical contacts disposed on said first spreader surface, a second set of spreader electrical contacts disposed on said second spreader surface, and a third set of spreader electrical contacts, said first set of spreader electrical contacts disposed in an area array and permanently bonded to corresponding electrical interface pins of said at least one integrated circuit die, at least a plurality of said second set of spreader electrical contacts electrically connected to corresponding contacts of said first set of spreader electrical contacts, at least a plurality of said third set of spreader electrical contacts electrically connected to corresponding contacts of said first set of spreader electrical contacts;

a cap bonded to said first spreader surface and covering said integrated circuit die;

a socket base having a first and a second surface and having an array of interstices therethrough;

a plurality of first conformal contacts inserted into said interstices and extending through and beyond said first surface of said socket base, said first conformal contacts in electrical contact with the members of said second set of spreader electrical contacts;

a plurality of second conformal contacts inserted into said interstices and extending through and beyond said second surface of said socket base, said second conformal contacts comprising electrically conductive non-deformable plungers in electrical contact, respectively, with said first conformal contacts and adapted to make removable electrical contact with contact pads of the circuit board;

a socket cover attached to said socket base by compressive attachment means for applying a compressive force urging said spreader against said first conformal contacts;

means located only at a periphery of the package for removably attaching the package to a circuit board by applying a compressive force urging all portions of the package toward said circuit board; and a flexible electrical cable having a first end, a second end, and a plurality of electrical conductors, wherein at least some members of said plurality of electrical conductors at said first end are electrically connected to at least some members of said third set of spreader electrical contacts and at least some members of said plurality of electrical conductors at said second end are electrically connected to a multi-conductor electrical connector disposed at said second end.

9. The package of claim 8 wherein at least some of the members of said third set of spreader electrical contacts are electrically connected to at least some members of said second set of spreader electrical contacts.

10. The package of claim 9 wherein said first set of spreader electrical contacts includes at least 500 separate electrical contacts.

11. The package of claim 10 wherein said first set of spreader electrical contacts has a pin density exceeding 2000 pins per square inch.

12. The package of claim 10 wherein said first set of spreader electrical contacts has a pin density exceeding 3000 pins per square inch.

13. A circuit board and component assembly comprising:

a first side;

a second side;

a first pad array of circuit board pads disposed in an array bounded by a first area on said first side;

a second pad array of circuit board pads disposed in an array bounded by a second area on said second side, said first area equal to said second area; and a first and a second reusable, self-contained integrated circuit die package for demountable attachment to the printed circuit board, said first package mounted to said first side and said second package mounted to said second side, each of said packages including:

at least one integrated circuit die having a plurality of electrical interface pins;

a spreader having a first spreader surface and a second spreader surface and including a first set of spreader electrical contacts disposed on said first spreader surface, a second set of spreader electrical contacts disposed on said second spreader surface, and a third set of spreader electrical contacts, said first set of spreader electrical contacts disposed in an area array and permanently bonded to corresponding electrical interface pins of said at least one integrated circuit die, at least a plurality of said second set of spreader electrical contacts electrically connected to corresponding contacts of said first set of spreader electrical contacts, at least a plurality of said third set of spreader electrical contacts electrically connected to corresponding contacts of said first set of spreader electrical contacts;

a cap bonded to said first spreader surface and covering said integrated circuit die;

a socket base having a first and a second surface and having an array of interstices therethrough;

a plurality of first conformal contacts inserted into said interstices and extending through and beyond said first surface of said socket base, said first conformal contacts in electrical contact with the members of said second set of spreader electrical contacts;

a plurality of second conformal contacts inserted into said interstices and extending through and beyond said second surface of said socket base, said second conformal contacts comprising electrically conductive non-deformable plungers in electrical contact, respectively, with said first conformal contacts and adapted to make removable electrical contact with contact pads of the circuit board;

a socket cover attached to said socket base by compressive attachment means for applying a compressive force urging said spreader against said first conformal contacts;

means located only at a periphery of the package for removably attaching the package to a circuit board by applying a compressive force urging all portions of the package toward said circuit board; and a flexible electrical cable having a first end, a second end, and a plurality of electrical conductors, wherein at least some members of said plurality of electrical conductors at said first end are electrically connected to at least some members of said third set of spreader electrical contacts and at least some members of said plurality of electrical conductors at said second end are electrically connected to a multi-conductor electrical connector disposed at said second end.

14. A reusable, self-contained integrated circuit die package for demountable attachment to a circuit board comprising:

at least one integrated circuit die including a plurality of interface pins;

a spreader having a first surface, a second surface, a first set of spreader electrical contacts disposed on said first surface and adapted to be electrically connected to said plurality of interface pins of said at least one integrated circuit die, a second set of spreader electrical contacts disposed on said second surface at least some of the members of which are electrically connected to at least some members of said first set of spreader electrical contacts and adapted for electrical connection to a circuit board, and a third set of spreader electrical contacts at least some of the members of which are electrically connected to at least some members of said first set of spreader electrical contacts, wherein said second set of spreader electrical contacts are disposed on a different surface of said spreader than are said third set of spreader electrical contacts;

a socket base having a first surface and a second surface and a first array of conformal electrical contacts extending through and beyond said first surface of said socket base and adapted to make electrical contact with the contacts of said second set of spreader electrical contacts, said first array of conformal electrical contacts in electrical contact with a second array of non-deformable conformal electrically conductive plungers extending through and beyond said second surface of said socket base and adapted to electrically contact electrically conductive pads on the circuit board;

a socket cover attached to said socket base by compressive attachment means for applying a compressive force urging said spreader against said first conformal contacts;

means located only at a periphery of the package for removably attaching the package to a circuit board by applying a compressive force urging all portions of the package toward said circuit board; and a flexible electrical cable having a first end, a second end, and a plurality of electrical conductors, wherein at least some members of said plurality of electrical conductors at said first end are electrically connected to at least some members of said third set of spreader electrical contacts, said socket base and said socket cover joined at a common line and including means for providing strain relief for said flexible electrical cable.

* * * * *